(12) United States Patent
Corsi et al.

(10) Patent No.: US 7,636,875 B2
(45) Date of Patent: Dec. 22, 2009

(54) LOW NOISE CODING FOR DIGITAL DATA INTERFACE

(75) Inventors: Marco Corsi, Parker, TX (US); Robert Floyd Payne, Lucas, TX (US)

(73) Assignee: Texas Instruments Incorporated, Dallas, TX (US)

(*) Notice: Subject to any disclaimer, the term of this patent is extended or adjusted under 35 U.S.C. 154(b) by 232 days.

(21) Appl. No.: 11/697,041

(22) Filed: Apr. 5, 2007

(65) Prior Publication Data

US 2008/0222390 A1   Sep. 11, 2008

Related U.S. Application Data

(60) Provisional application No. 60/893,820, filed on Mar. 8, 2007.

(51) Int. Cl.
*G06F 11/00* (2006.01)
(52) U.S. Cl. .................................................... 714/701
(58) Field of Classification Search ................ 714/702, 714/735, 736, 819, 701, 712; 375/224, 225, 375/227; 341/110
See application file for complete search history.

(56) References Cited

U.S. PATENT DOCUMENTS

| | | | |
|---|---|---|---|
| 4,085,287 A | 4/1978 | Kullmann et al. | |
| 4,675,652 A | 6/1987 | Machado | |
| 6,456,219 B1 | 9/2002 | Schreiber et al. | |
| 6,662,332 B1 | 12/2003 | Kimmitt | |
| 7,050,352 B2 | 5/2006 | Cha | |
| 7,138,932 B1 | 11/2006 | Chen | |
| 7,181,485 B1 | 2/2007 | Lau et al. | |
| 7,356,756 B1 * | 4/2008 | Chan et al. | 714/781 |
| 2005/0232033 A1 | 10/2005 | Cha | |
| 2006/0082609 A1 | 4/2006 | Walmsley et al. | |

* cited by examiner

*Primary Examiner*—Phung My Chung
(74) *Attorney, Agent, or Firm*—John J. Patti; Wade J. Brady, III; Frederick J. Telecky, Jr.

(57) ABSTRACT

A digital data interface system comprises a data transmitter configured to transmit a data word across a plurality of data lines. The data word can comprise a plurality of digital data bits having a bit number order from a lowest bit number to a highest bit number with the lowest ordered bit numbers having higher noise content and the highest ordered bit numbers having higher harmonic content. The system also comprises an encoder configured to arrange the plurality of digital data bits as serialized data sets to be transmitted over each of the plurality of data lines by the data transmitter with consecutive data bits of at least one serialized data set being matched such that bits with the higher harmonic content are matched with bits of the higher noise content to substantially mitigate of at least one of the noise content and the harmonic content of the data word.

17 Claims, 4 Drawing Sheets

LOW NOISE CODING FOR DIGITAL DATA INTERFACE

RELATED APPLICATIONS

The present invention claims priority from U.S. Provisional Patent Application No. 60/893,820, filed Mar. 8, 2007, the entire contents of which is hereby incorporated herein.

TECHNICAL FIELD

This invention relates to electronic circuits, and more specifically to low noise coding for a digital data interface.

BACKGROUND

The demand for communications systems, such as network, computer, and/or wireless solutions, is constantly increasing. As a result, electronic devices that incorporate integrated circuits (ICs) are continually designed to operate at greater speeds with more efficiency. In a given electronic device, many interconnected ICs are designed to operate and communicate with each other based on very specific timing. As a result, the operation of different components in an electronic device can be synchronized for fast and efficient operation. In addition, as the amount of data that is transferred between two or more integrated circuits increases, data can be organized into data frames, such that data can be transferred in both a serial and parallel manner at higher data rates, such as double-data rate (DDR), triple-data rate, (TDR), or more.

In a high data-rate digital data interface system, a data receiver may require synchronization information from a data transmitter from which the data is provided. For example, the data receiver may require a clock signal to synchronizing timing between the two ends of a data link that interconnects the data transmitter and the data receiver. The data that is transmitted from the data transmitter to the data receiver can be organized into a data frame, such as a data word that is a digital representation of a sample of an analog signal. As such, the data corresponding to the most significant bits (MSBs) and the least significant bits (LSBs) can be ordered by the data receiver to properly reassemble the data.

FIG. 1 illustrates an example of a typical digital data interface system 10. The digital data interface system 10 includes a data transmitter 12 configured to transmit digital data signals to a data receiver 14. The data transmitter 12 can be any of a variety of devices configured to transmit data at a high data rate, such as an analog-to-digital converter (ADC). As another example, the data receiver 14 can be configured to convert digital data transmitted in the digital data signals into analog data, such that the data receiver 14 can be configured as a digital-to-analog converter (DAC). In the example of FIG. 1, the data transmitter 12 provides signals to the data receiver 14 across a plurality of data lines 16. Specifically, the data transmitter 12 provides a clock signal CLK to the data receiver 14, as well as six data signals labeled $D_0$ through $D_5$. Each of the data signals can include consecutive serial data, such that the data that is transmitted from the data transmitter 12 to the data receiver 14 can be organized into data frames, such as data words that are digital representations of respective samples of an analog signal.

FIG. 2 illustrates an example of a timing diagram 50 associated with the digital data interface system 10 of the example of FIG. 1. The timing diagram 50 demonstrates the six digital data signals $D_0$ through $D_5$. The digital data signals $D_0$ through $D_5$ carry bits of a twelve-bit data word 52 having bit numbers B0 through B11, where the bit numbers B0 through B11 are ordered from a lowest ordered LSB to a highest ordered MSB. It is to be understood that, as described herein, the lower-half of the bit numbers of a data word are the LSBs and the upper-half of the bit numbers of a data word are the MSBs. Therefore, in the example of FIG. 2, bits B0 through B5 are the LSBs of the data word 52, with the bit B0 being the lowest ordered LSB, and bits B6 through B11 are the MSBs of the data word 52, with the bit B11 being the highest ordered MSB.

In the example of FIG. 2, the digital data signal $D_0$ includes bits B0 and B1, the digital data signal $D_1$ includes bits B2 and B3, the digital data signal $D_2$ includes bits B4 and B5, the digital data signal $D_3$ includes bits B6 and B7, the digital data signal $D_4$ includes bits B8 and B9, and the digital data signal $D_5$ includes bits B10 and B11. Accordingly, the data word 52 is transmitted in an even/odd manner, such that the even bit numbers of the data word 52 are transmitted first, followed by the odd bit numbers of the data word 52. Thus, in the example of FIG. 2, the digital data signals $D_0$ through $D_2$ carry the LSBs of the data word 52, and the digital data signals $D_3$ through $D_5$ carry the MSBs of the data word 52.

In the example of FIG. 1, the data receiver 14 includes a data decoder 18. Upon the data receiver 14 receiving the clock signal CLK and the data signals $D_0$ through $D_5$, the data decoder 18 latches the data from the data signals $D_0$ through $D_5$ based on the clock signal CLK. In the example of FIG. 2, the data word 52 is transmitted at a DDR. Specifically, at a time $T_0$, the clock signal CLK has a rising-edge, at which time the data decoder 18 latches the even bits B0, B2, B4, B6, B8, and B10. At a time $T_1$, the clock signal CLK has a falling-edge, at which time the data decoder 18 latches the odd bits B1, B3, B5, B7, B9, and B11. Thus, subsequent to the time $T_1$, the data receiver 14 can reorder the latched data bits B0 through B11 from LSB to MSB to properly assemble the data word 52.

FIG. 3 illustrates another example of a timing diagram 100 associated with the digital data interface system 10 of the example of FIG. 1. The timing diagram 100 demonstrates the six digital data signals $D_0$ through $D_5$. The digital data signals $D_0$ through $D_5$ carry bits of a twelve-bit data word 102 having bit numbers B0 through B11, where the bit numbers B0 through B11 are ordered from a lowest ordered LSB to a highest ordered MSB, similar to as described above. Specifically, in the example of FIG. 3, bits B0 through B5 are the LSBs of the data word 102, with the bit B0 being the lowest ordered LSB, and bits B6 through B11 are the MSBs of the data word 102, with the bit B11 being the highest ordered MSB.

In the example of FIG. 3, the digital data signal $D_0$ includes bits B0 and B6, the digital data signal $D_1$ includes bits B1 and B7, the digital data signal $D_2$ includes bits B2 and B8, the digital data signal $D_3$ includes bits B3 and B9, the digital data signal $D_4$ includes bits B4 and B10, the digital data signal $D_5$ includes the B5 and B11. Accordingly, the data word 102 is transmitted in an LSB/MSB manner, such that the LSBs of the data word 102 are transmitted first, followed by the MSBs of the data word 102. Thus, in the example of FIG. 3, the digital data signals $D_0$ through $D_5$ alternate in carrying the LSBs and the MSBs of the data word 102.

Similar to as described above in the example of FIG. 2, the data word 102 in the example of FIG. 3 is transmitted at a DDR. Specifically, at a time $T_0$, the clock signal CLK has a rising-edge, at which time the data decoder 18 latches the LSBs B0 through B5. At a time $T_1$, the clock signal CLK has a falling-edge, at which time the data decoder 18 latches the MSBs B6 through B11. Thus, subsequent to the time $T_1$, the data receiver 14 can reorder the latched data bits B0 through B11 from LSB to MSB to properly assemble the data word 102.

In the example of FIGS. 2 and 3, it is demonstrated that a pin count for a given digital data interface system can be reduced by serializing the data transmitted across each data line. However, in a given data word that is representative of an analog signal sample, the different bits of the data word in a serialized data transmission can include components that affect the performance of the associated DAC or ADC. For example, the LSBs of a given data word can include noise content, such as quantization noise and/or thermal noise, with the lowest ordered LSB including the greatest amount of noise content. In addition, the MSBs of a given data word can include harmonic content of the analog signal, with the highest ordered MSB including the most harmonic content. As such, the harmonic content and noise can distort the analog performance, thus resulting in inaccuracies in the operation of the associated DAC or ADC. Some typical digital data interface systems can reduce noise and/or harmonic content interference by increasing power, but do so at the cost of power efficiency.

SUMMARY

One embodiment of the present invention includes a digital data interface system. The system includes a data transmitter configured to transmit a data word across a plurality of data lines. The data word can comprise a plurality of digital data bits having a bit number ordered from a lowest bit number to a highest bit number with the lowest ordered bit numbers having higher noise content than the highest ordered bit numbers and the highest ordered bit numbers having higher harmonic content than the lowest ordered bit numbers. The system also comprises an encoder configured to arrange the plurality of digital data bits as serialized data sets to be transmitted over each of the plurality of data lines by the data transmitter with consecutive data bits of at least one serialized data set being matched such that bits with the higher harmonic content are matched with bits of the higher noise content to substantially mitigate the deleterious effects of at least one of the noise content and the harmonic content of the data word.

Another embodiment of the present invention includes a method for transmitting digital data. The method comprises forming a data word comprising a plurality of digital data bits each having a bit number that is ordered from a lowest numbered least significant bit (LSB) to a highest numbered most significant bit (MSB) wherein the lower the bit number order the higher the noise content and the higher the bit number order the higher the harmonic content. The method also comprises arranging the plurality of digital data bits into at least one serialized data set having bit number ordering that is selected to combine bits having higher harmonic content with bits having higher noise content to mitigate one of the overall noise content and the overall harmonic content of the data word. The method further comprises transmitting the at least one serialized data set across one or more data lines.

Another embodiment of the present invention includes a digital data interface system. The system comprises means for generating a data word comprising a plurality of digital data bits. The data word can comprise a plurality of digital data bits each having a bit number order that is ordered from a lowest numbered least significant bit (LSB) to a highest numbered most significant bit (MSB). The system also comprises means for arranging the plurality of digital data bits into a plurality of serialized data pairs with consecutive data bits of each serialized data pair having bit number orders that are symmetrically opposite each other in the data word. The system further comprises means for transmitting the plurality of serialized data pairs across one or more data lines.

DETAILED DESCRIPTION

The present invention relates to electronic circuits, and more specifically to low noise coding for a data interface. In a digital data interface system, a data transmitter transmits a data word having a plurality of data bits across a plurality of data lines to a data receiver, the plurality of data bits having a bit number order from a lowest numbered least significant bit (LSB) to a highest numbered most significant bit (MSB) of the data word. The data bits that are transmitted can be arranged in serialized data sets such that consecutive data bits are matched such that a higher ordered bit numbers that carry higher harmonic content are matched with lower ordered bit numbers that carry higher noise content. As an example, the highest numbered MSB of the data word can be paired with the lowest numbered LSB of the data word, such that the bit having the highest harmonic content is paired with the bit having the highest noise content. The harmonic content and the noise content can thus combine substantially mitigate the deleterious effects of the noise content and/or the harmonic content of the data word. Each of the remaining MSB/LSB pairs can thus also be combined such that bits with the higher harmonic content are matched with bits of the higher noise content. As a result, harmonic distortion of the analog performance of the digital data interface system can be reduced at no additional power expense.

Figure 1:
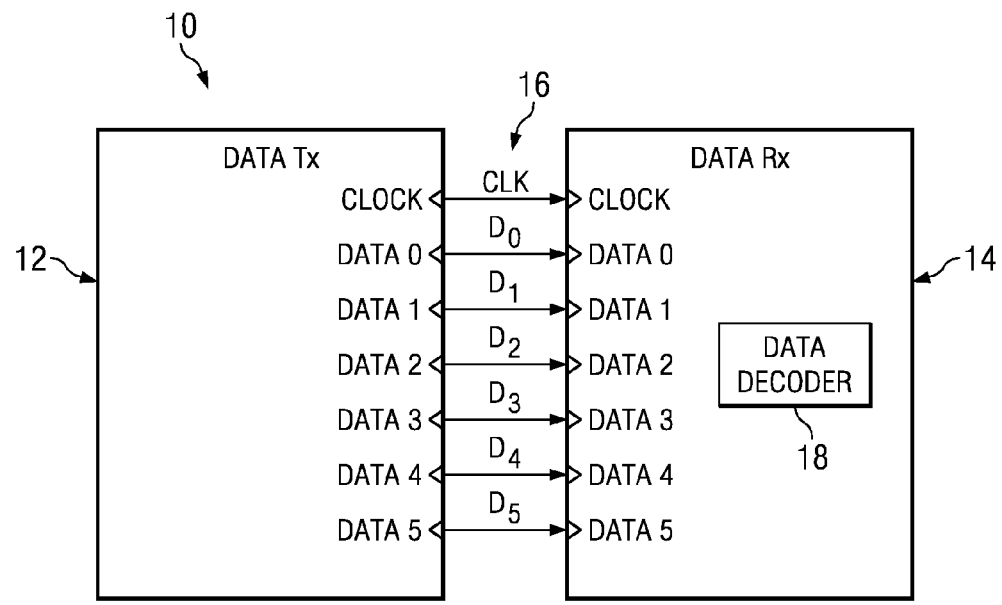
FIG. 1 illustrates an example of a digital data interface system.
Figure 2:
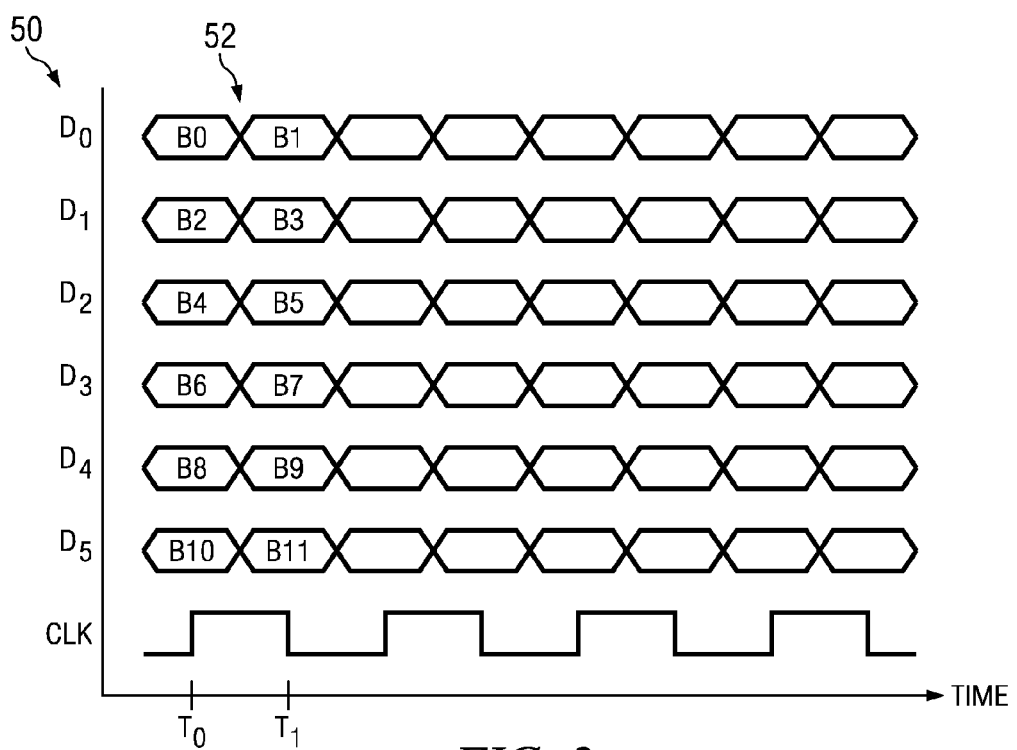
FIG. 2 illustrates an example of a timing diagram associated with the digital data interface system of FIG. 1.
Figure 3:
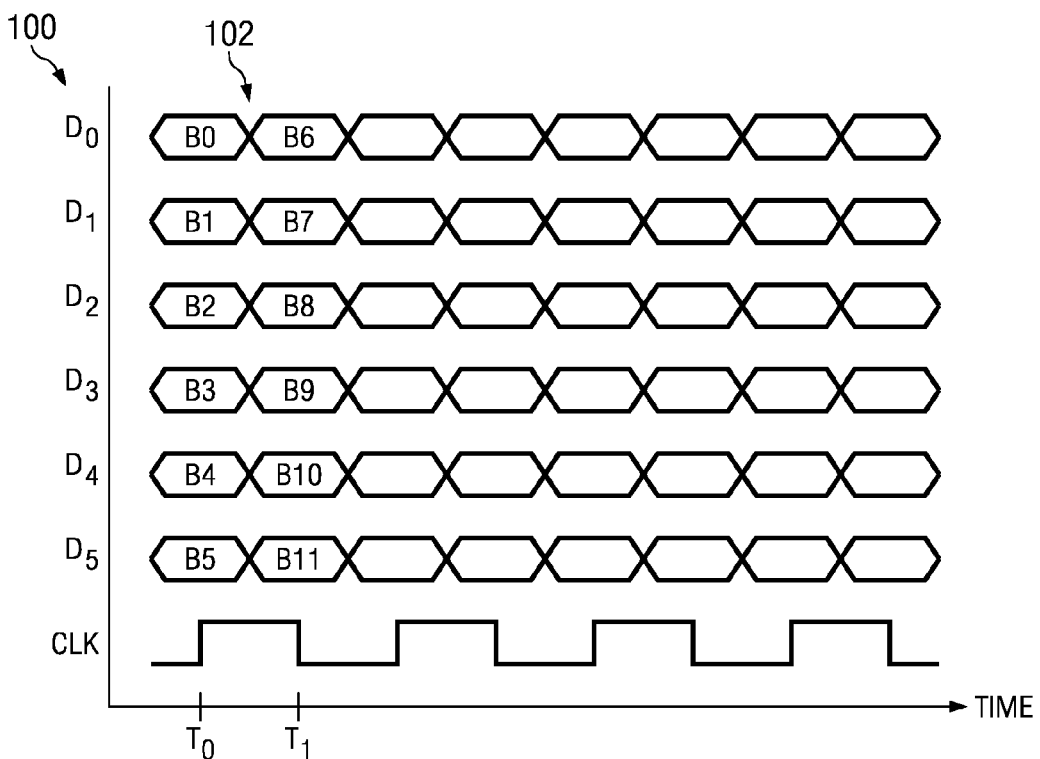
FIG. 3 illustrates an example of a timing diagram associated with the digital data interface system of FIG. 1.
Figure 4:
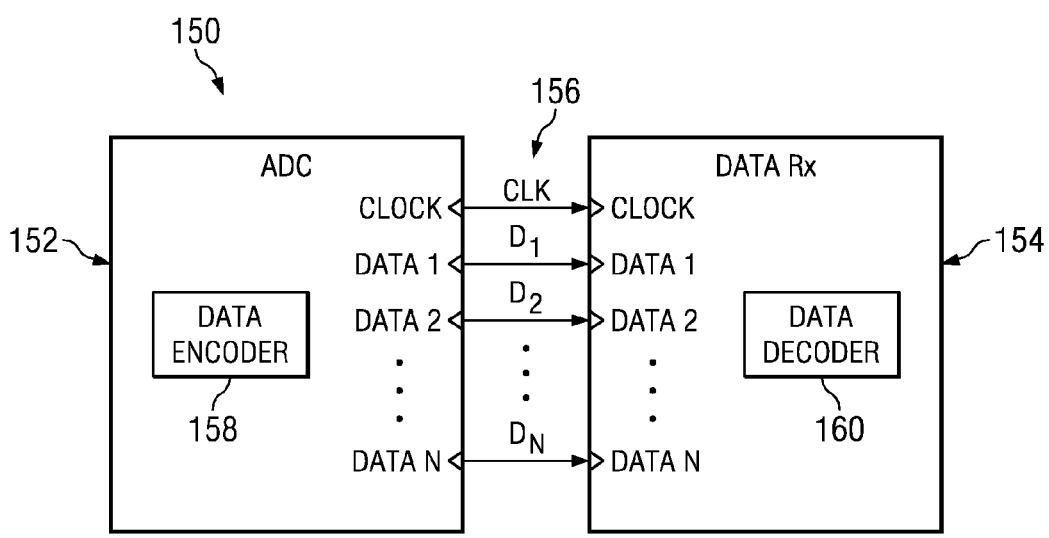
FIG. 4 illustrates an example of a digital data interface system in accordance with an aspect of the invention.

FIG. 4 illustrates an example of a digital data interface system 150 in accordance with an aspect of the invention. The digital data interface system 150 includes a data transmitter 152 configured to transmit digital data signals to a date receiver 154. The data transmitter 152 can be any of a variety of devices configured to transmit data at a high data rate, such as an analog-to-digital converter (ADC). As another example, the data receiver 154 can be configured to convert digital data transmitted in the digital data signals into analog data, such that the data receiver 154 can be configured as a digital-to-analog converter (DAC). In the example of FIG. 4, the data transmitter 152 provides signals to the data receiver 154 across a plurality of data lines 156. Specifically, the data transmitter 152 provides a clock signal CLK to the data receiver 154, as well as a plurality N of data signals, where N is a positive integer greater than zero. In the example of FIG. 4, the data signals are labeled $D_0$ through $D_N$. Each of the data signals can include consecutive serialized data sets, such that the data that is transmitted from the data transmitter 152 to the data receiver 154 can be organized into data frames, such as data words that are digital representations of respective samples of an analog signal.

The data transmitter 152 includes a data encoder 158 configured to arrange the digital bits of a data word for transmission across the data lines 156. As an example, the data encoder 158 can arrange two or more data bits of a data word to be transmitted serially on each of the data lines 156. As a result, the number of data lines 156 that may be required to transmit a given size of data word can be reduced. In addition, the rate at which the data bits are transmitted can be approximately equal to half a period of the clock signal CLK. Therefore, the data bits of the data word can be transmitted at a double data rate (DDR), a triple data rate (TDR), a quadruple data rate (QDR), or more. The data receiver 154 includes a data decoder 160 configured to latch the data bits from the date lines 156 based on a rising-edge and/or a falling-edge of the clock signal CLK. The data decoder 160 can thus also be configured to reorder the data bits from an LSB to an MSB to properly assemble the data word.

Figure 5:
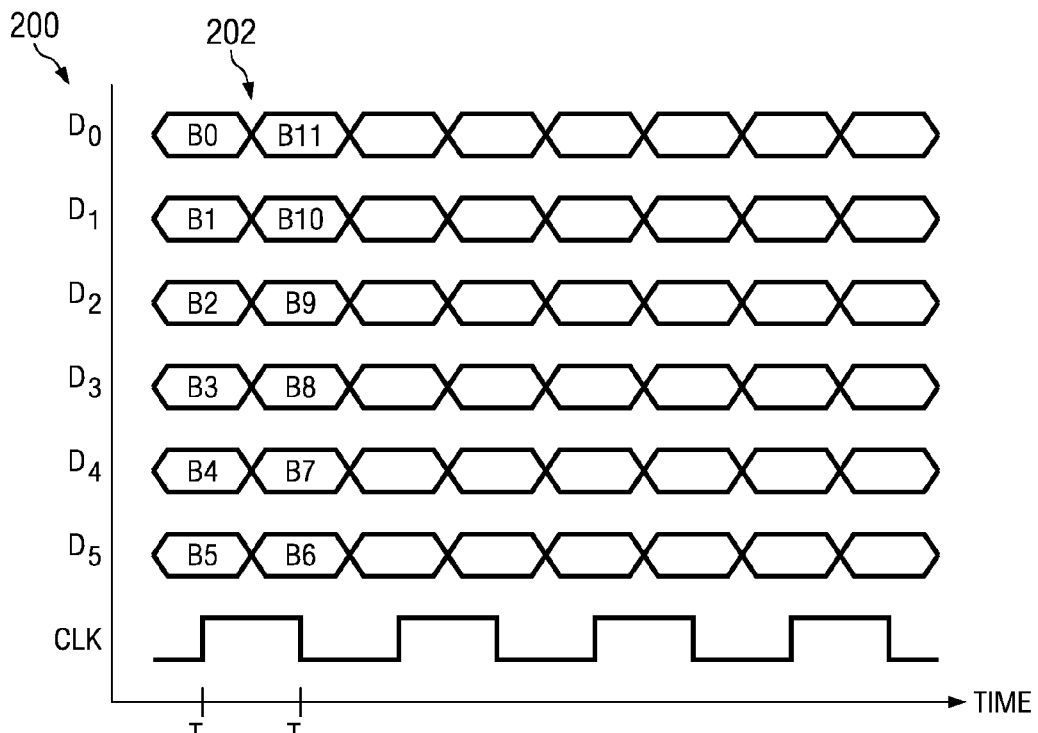
FIG. 5 illustrates an example of a timing diagram associated with the digital data interface system of FIG. 4 in accordance with an aspect of the invention.

FIG. 5 illustrates an example of a timing diagram 200 associated with the digital data interface system 150 of the example of FIG. 4. The timing diagram 200 demonstrates six digital data signals $D_0$ through $D_5$, such that the number N of data lines in the example of FIG. 4 is six. It is to be understood, however, that six data lines is but one example of the number of data lines that can be implemented in the example of FIG. 4. The digital data signals $D_0$ through $D_5$ carry bits of a twelve-bit data word 202 having bit numbers B0 through B11. It is to be understood that, as described herein, the lower-half of the bit numbers of a data word are the LSBs and the upper-half of the bit numbers of a data word are the MSBs. Therefore, in the example of FIG. 5, bits B0 through B5 are the LSBs of the data word 202, with the bit B0 being the lowest ordered LSB, and bits B6 through B11 are the MSBs of the data word 202, with the bit B11 being the highest ordered MSB. Accordingly, the bit numbers B0 through B11 are sequentially ordered from a lowest ordered LSB (i.e., B0) to a highest ordered MSB (i.e., B11).

In the example of FIG. 5, the digital data signal $D_0$ includes bits B0 and B11, the digital data signal $D_1$ includes bits B1 and B10, the digital data signal $D_2$ includes bits B2 and B9, the digital data signal $D_3$ includes bits B3 and B8, the digital data signaled $D_4$ includes bits B4 and B7, and the digital data signal $D_5$ includes bits B5 and B6. Accordingly, in the example of FIG. 5, the data encoder 158 arranges the data bits in data pairs for transmission on each of the data signals $D_0$ through $D_5$, with each pair having an LSB and an MSB. Thus, the digital data signals $D_0$ through $D_5$ alternate in carrying the LSBs and the MSBs of the data word 202. However, in the example of FIG. 5, each of the LSB/MSB pairs has higher ordered bit numbers paired with lower ordered bit numbers. As described above, higher ordered bit numbers may carry higher harmonic content, and lower ordered bit numbers carry higher noise content. Therefore, in the example of FIG. 5, bits of higher harmonic content are paired with bits of higher noise content. As a result, the higher noise content can combine with the harmonic content to substantially improve analog performance associated with the digital data interface system 150.

In the example of FIG. 5, the digital data signal $D_0$ transmits a data pair that includes the lowest ordered LSB B0 and the highest ordered MSB B11. The lowest ordered LSB B0 and the highest ordered MSB B11 are symmetrical opposites about the division of the LSBs and MSBs (i.e., between the bits B5 and B6) in the data word 202. The highest ordered MSB B11 can include the most harmonic content, and the lowest ordered LSB can include the most noise content. Therefore, the highest noise content of the bit B0 can be combined with the highest harmonic content of the bit B11 to substantially mitigate the deleterious effects of the harmonic content and/or the noise content. Each of the remaining data pairs on each of the respective remaining digital signals is arranged by the data encoder 158 to have an amount that the LSB is incremented from the lowest ordered LSB that is equal to the amount that the MSB is decremented from the highest ordered MSB. Thus, each of the bit orders in each of the data pairs are likewise symmetrically opposite the LSB/MSB division. As a result, similar to the B11/B0 pair, the decreasing amounts of harmonic content of the higher ordered data bits are destructively combined with the respective decreasing amounts of noise content of the lower ordered data bits to likewise substantially mitigate the deleterious effects of the harmonic content and/or the noise content.

Upon the data receiver 154 receiving the clock signal CLK and the data signals $D_0$ through $D_5$, the data decoder 160 latches the data from the data signals $D_0$ through $D_5$ based on the clock signal CLK. In the example of FIG. 5, the data word 202 is transmitted at a DDR. Specifically, at a time $T_0$, the clock signal CLK has a rising-edge, at which time the data decoder 160 latches the LSBs B0, B1, B2, B3, B4, and B5. At a time $T_1$, the clock signal CLK has a falling-edge, at which time the data decoder 160 latches the MSBs B11, B10, B9, B8, B7, and B6. Thus, subsequent to the time $T_1$, the data receiver 154 can reorder the latched data bits B0 through B11 from LSB to MSB to properly assemble the data word 202.

As a result of the arrangement of the data pairs of the data word 202, distortion of the analog performance of an associated DAC or ADC that is introduced by the overall harmonic content and/or the overall noise content of the data word 202 can be substantially mitigated. Furthermore, because the reduced distortion of the analog performance of digital data interface system 150 results from reordering bits in the transmitted data word 202, the digital data interface system 150 may require no additional power consumption to achieve an improved analog performance. It is to be understood that the data word 202 is not limited to the arrangement demonstrated in the example of FIG. 5. As an example, the LSBs need not be arranged such that they are transmitted on consecutive digital data signals. As another example, the data pairs could be reversed, such that the MSBs are transmitted before the LSBs. Accordingly, the transmission of the data word 202 can be performed in any of a variety of configurations.

Figure 6:
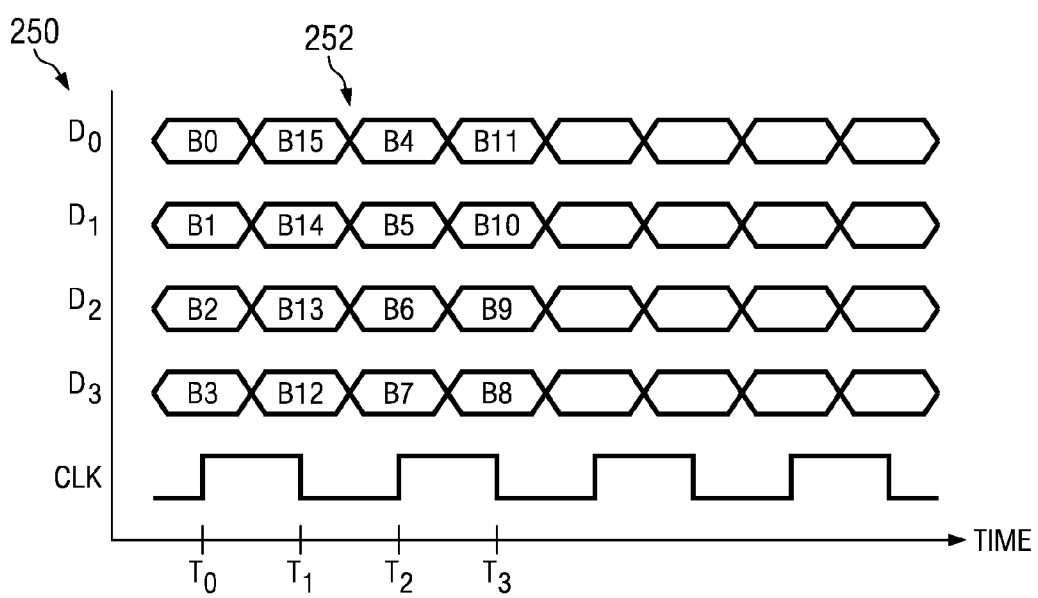
FIG. 6 illustrates another example of a timing diagram associated with the digital data interface system of FIG. 4 in accordance with an aspect of the invention.

FIG. 6 illustrates an example of a timing diagram 250 associated with the digital data interface system 150 of the example of FIG. 4. The timing diagram 250 demonstrates four digital data signals $D_0$ through $D_3$, such that the number N of data lines in the example of FIG. 4 is four. The digital data signals $D_0$ through $D_3$ carry bits of a sixteen-bit data word 252 having bit numbers B0 through B15, where the bit numbers B0 through B15 are ordered from a lowest bit number order LSB to a highest bit number order MSB.

In the example of FIG. 6, the digital data signal $D_0$ includes bit B0, B15, B4, and B11; the digital data signal $D_1$ includes bits B1, B14, B5, and B10; the digital data signal $D_2$ includes bits B2, B13, B6, and B9; and the digital data signal $D_3$ includes bits B3, B12, B7, and B8. Accordingly, in the example of FIG. 6, the data encoder 158 arranges the data bits in two pairs for transmission on each of the data signals $D_0$ through $D_3$, with each pair having an LSB and MSB. Thus, the digital data signals $D_0$ through $D_3$ alternate in carrying the LSBs and the MSBs of the data word 252.

Upon the data receiver 154 receiving the clock signal CLK and the data signals $D_0$ through $D_3$, the data decoder 160 latches the data from the data signals $D_0$ through $D_3$ based on the clock signal CLK. In the example of FIG. 6, the data word 252 is transmitted at a QDR. Specifically, at a time $T_0$, the clock signal CLK has a rising-edge, at which time the data decoder 160 latches the LSBs B0, B1, B2, and B3. At a time $T_1$, the clock signal CLK has a falling-edge, at which time the data decoder 160 latches the MSBs B15, B14, B13, and B12. At a time $T_2$, the clock signal CLK has another rising-edge, at which time the data decoder 160 latches the LSBs B4, B5, B6, and B7. At a time $T_3$, the clock signal CLK has another falling-edge, at which time the data decoder 160 latches the MSBs B11, B10, B9, and B8. Thus, subsequent to the time $T_3$, the data receiver 154 can reorder the latched data bits B0 through B15 from LSB to MSB to properly assemble the data word 252.

In the example of FIG. 6, the digital data signal $D_0$ carries a serialized data pair that includes the lowest ordered LSB B0 and the highest ordered MSB B15. The lowest ordered LSB B0 and the highest ordered MSB B15 are symmetrical opposites about the division of the LSBs and MSBs (i.e., between the bits B7 and B8) in the data word 252, as are the remaining data pairs that are transmitted concurrently with the lowest ordered LSB0 and highest ordered MSB B15 at times $T_0$ and $T_1$, and subsequent to the lowest ordered LSB0 and highest ordered MSB B15 at times $T_2$ and $T_3$. A such, the remaining data pairs are also symmetrically opposite the division of the LSBs and the MSBs. Therefore, similar to as described above in the example of FIG. 5, the arrangement of the data pairs of the data word 242 can substantially mitigate distortion of the analog performance of an associated DAC or ADC that is introduced by overall harmonic content and/or overall noise content of the data word 252.

It is to be understood that the data word 252 is not limited to the arrangement demonstrated in the example of FIG. 6. As an example, the LSBs need not be arranged such that they are transmitted on consecutive digital data signals. As another example, the data pairs could be reversed, such that the MSBs are transmitted before the LSBs. Accordingly, the transmission of the data word 252 can be performed in any of a variety of configurations.

Figure 7:
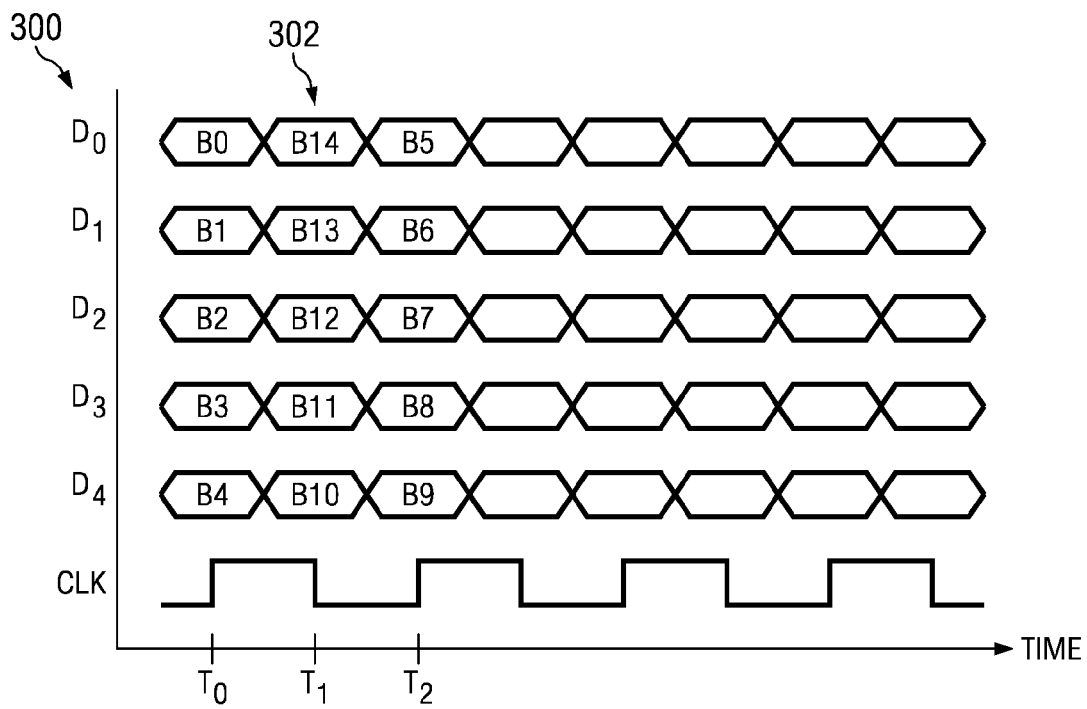
FIG. 7 illustrates another example of a timing diagram associated with the digital data interface system of FIG. 4 in accordance with an aspect of the invention.

FIG. 7 illustrates an example of a timing diagram 300 associated with the digital data interface system 150 of the example of FIG. 4. The timing diagram 300 demonstrates five digital data signals $D_0$ through $D_4$, such that the number N of data lines in the example of FIG. 4 is five. The digital data signals $D_0$ through $D_4$ carry bits of a fifteen-bit data word 302 having bit numbers B0 through B14, where the bit numbers B0 through B14 are ordered from a lowest ordered LSB to a highest ordered MSB.

In the example of FIG. 7, the digital data signal $D_0$ serially transmits bits B0, B14, and B5; the digital data signal $D_1$ serially transmits bits B1, B13, and B6; the digital data signal $D_2$ serially transmits bits B2, B12, and B7; the digital data signal $D_3$ serially transmits bits B3, B11, and B8; and the digital data signal $D_4$ serially transmits bits B4, B10, and B9. Accordingly, in the example of FIG. 7, the data encoder 158 arranges the data bits in pairs for transmission on each of the digital data signals $D_0$ through $D_4$, with each pair having an LSB and an MSB, as well as an additional bit on each of the digital data signals. Thus, the digital data signals $D_0$ through $D_4$ alternate in carrying the LSBs and the MSBs of the data word 302. In addition, the data encoder 158 also arranges the additional bit on each of the digital data signals $D_0$ through $D_4$ to occupy a center third of the digital bits of the data word 302. Specifically, the bits B8 and B9 are the lowest ordered MSBs, the bits B5 and B6 are the highest ordered LSBs, and B7 is the centermost bit in the fifteen-bit data word 302.

Upon the data receiver 154 receiving the clock signal CLK and the data signals $D_0$ through $D_4$, the data decoder 160 latches the data from the data signals $D_0$ through $D_4$ based on the clock signal CLK. In the example of FIG. 7, the data word 302 is transmitted at a TDR. Specifically, at a time $T_0$, the clock signal CLK has a rising-edge, at which time the data decoder 160 latches the LSBs B0, B1, B2, B3, and B4. At a time $T_1$, the clock signal CLK has a falling-edge, at which time the data decoder 160 latches the MSBs B14, B13, B12, B11 and B10. At a time $T_2$, the clock signal CLK has another rising-edge, at which time the data decoder 160 latches the remaining additional bits B5, B6, B7, B8, and B9. Thus, subsequent to the time $T_2$, the data receiver 154 can reorder the latched data bits B0 through B14 from LSB to MSB to properly assemble the data word 302. It is to be understood that, because the example of FIG. 7 demonstrates that the data word 302 occupies one and a half clock cycles of the clock signal CLK, the receiver 154 may include a phase-locked loop or a delay-locked loop to define a beginning and/or an end of the data word 302. As another example, the data transmitter 152 could include a frame signal that is transmitted to the data receiver 154 to define a beginning and/or an end of the data word 302.

In the example of FIG. 7, the digital data signal $D_0$ carries a data pair that includes the lowest ordered LSB B0 and the highest ordered MSB B14. The lowest ordered LSB B0 and the highest ordered MSB B14 are symmetrical opposites about the division of the LSBs and MSBs (i.e., the bit B7) in the data word 302. Similar to the example of FIG. 5, each of the remaining data pairs on each of the respective remaining digital signals is arranged by the data encoder 158 to have an amount that the LSB is incremented from the lowest ordered LSB that is equal to the amount that the MSB is decremented from the highest ordered MSB. As such, the remaining data pairs are also symmetrically opposite the division of the LSBs and the MSBs. Therefore, similar to as described above in the example of FIG. 5, the arrangement of the data pairs of the data word 302 can substantially reduce distortion of the analog performance of an associated DAC or ADC that is introduced by harmonic content and/or noise content. In addition, the encoder 158 also arranges the additional bits in the center third of the data word 302 to be matched with a bit of the data pair on the respective data line such that the bits with increasingly higher harmonic content from the center third are matched with bits of increasingly higher noise content from the data pairs.

It is to be understood that the data word 302 is not limited to the arrangement demonstrated in the example of FIG. 7. As an example, the LSBs need not be arranged such that they are transmitted on consecutive digital data signals. As another example, the data pairs could be reversed, such that the MSBs are transmitted before the LSBs. Furthermore, because the additional bit that is transmitted on each of the digital data signals subsequent to the first data pair occupies the center third of the digital bits of the data word 302, they include substantially the least amount of harmonic content and/or noise. Thus, they may not substantially affect the analog performance of the associated DAC or ADC, and can be configured with different data pairs than that demonstrated in the example of FIG. 7. Accordingly, the transmission of the data word 302 can be performed in any of a variety of configurations.

Figure 8:
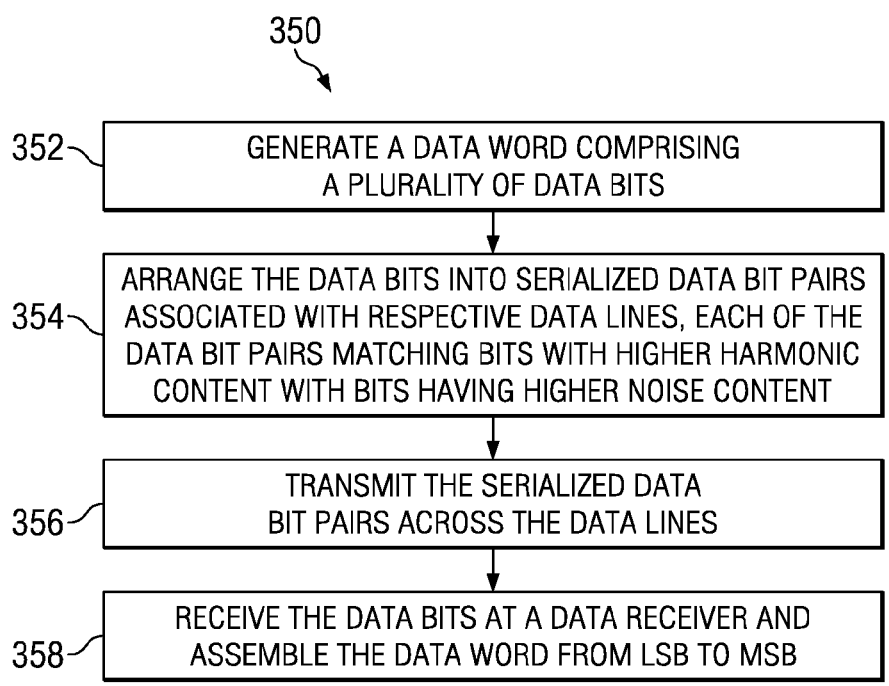
FIG. 8 illustrates a method for transmitting digital data in accordance with an aspect of the invention.

In view of the foregoing structural and functional features described above, certain methods will be better appreciated with reference to FIG. 8. It is to be understood and appreciated that the illustrated actions, in other embodiment, may occur in different orders and/or concurrently with other actions. Moreover, not all illustrated features may be required to implement a method.

FIG. 8 illustrates a method 350 for transmitting digital data in accordance with an aspect of the invention. At 352, a data word comprising a plurality of digital data bits is generated. The data word can be a digital representation of an analog signal sample. The digital data bits in the data word can be ordered from a lowest numbered LSB to a highest numbered MSB. At 354, the plurality of digital data bits are arranged into a plurality of serialized data bit pairs associated with a respective plurality of data lines, with each of the data bit pairs matching bits with the higher harmonic content with bits of the higher noise content to substantially mitigate the deleterious effects of the noise content and/or the harmonic content of the data word. The data pairs can include an MSB and an LSB that are symmetrically opposite each other in the data word. Noise associated with the LSBs can combine with harmonic content associated with the MSBs, thus improving the analog performance associated with the data.

At 356, the serialized data bit pairs are transmitted across the plurality of data lines. The data can be transmitted at a DDR, a TDR, or a QDR. At 358, the serialized data bit pairs are received at a data receiver and the data word is assembled from LSB to MSB. The data transmitter can be configured as an ADC, such that the assembled data word can be a digital representation of a sample of the analog signal. As an alternative, the data receiver can be configured as a DAC, such that the assembled data word can be converted to an analog signal sample.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A digital data transmitter comprising:
   a plurality of data lines, wherein a data word having a plurality of digital data bits is communicated over the data lines, and wherein each digital data bits has a bit number order that ranges from a lowest bit number to a highest bit number with the lowest ordered bit numbers having higher noise content than the highest ordered bit numbers and the highest ordered bit numbers having higher harmonic content than the lowest ordered bit numbers; and
   an encoder that is in communication with the data lines, wherein the encoder arranges the plurality of digital data bits of the data word as serialized data sets to be transmitted over each of the plurality of data lines with consecutive data bits of at least one serialized data set being matched such that bits with the higher harmonic content are matched with bits of the higher noise content.

2. The transmitter of claim 1, wherein the at least one serialized data set comprises a least significant bit (LSB) and a most significant bit (MSB) of the data word.

3. The transmitter of claim 1, wherein the at least one serialized data set comprises a plurality of serialized data pairs with consecutive data bits of each serialized data pair having bit number orders that are symmetrically opposite each other in the data word.

4. The transmitter of claim 1, wherein the lower the bit number order the higher the noise content and the higher the bit number order the higher the harmonic content, the at least one serialized data set comprising a plurality of serialized data sets with each data set having bit number ordering that is selected to combine bits having increasingly higher harmonic content with respective bits having increasingly higher noise content to mitigate at least one of the overall noise content and the overall harmonic content of the data word.

5. The transmitter of claim 4, wherein each serialized data set comprises a data pair having bit number orders that are symmetrically opposite each other in the data word and one additional bit from a center third of the plurality of digital data bits within the data word, the one additional data bit being matched with a bit of a respective data pair such that bits with increasingly higher harmonic content from the center third are matched with bits of increasingly higher noise content from the data pairs.

6. The transmitter of claim 1, wherein the data transmitter is configured to transmit the data word at one of a double data rate (DDR), a triple data rate (TDR) and a quadruple data rate (QDR).

7. The transmitter of claim 1, wherein the at least one serialized data set comprises a first pair of consecutively transmitted data bits followed by a second pair of consecutively transmitted data bits provided on a given data line, the first pair of data bits having bit number orders that are symmetrically opposite each other in the data word, and the second pair of data bits having bit number orders that are symmetrically opposite each other in the data word.

8. The transmitter of claim 1, further comprising a digital data receiver comprising a digital-to-analog converter (DAC) configured to convert the data word into a corresponding analog signal.

9. The transmitter of claim 1, wherein the data transmitter comprises an analog-to-digital converter (ADC) configured to generate the data word from a sample of an analog signal.

10. A method for transmitting digital data, the method comprising:
    forming a data word having a plurality of digital data bits each having a bit number that is ordered from a lowest numbered least significant bit (LSB) to a highest numbered most significant bit (MSB) wherein the lower the bit number order the higher the noise content and the higher the bit number order the higher the harmonic content;
    arranging, with an encoder, the plurality of digital data bits into at least one serialized data set having bit number ordering that is selected to combine bits having higher harmonic content with bits having higher noise content to mitigate one of the overall noise content and the overall harmonic content of the data word; and
    transmitting, with a transmitter, the at least one serialized data set across one or more data lines.

11. The method of claim 10, wherein the arranging the plurality of digital data bits into at least one serialized data set comprises arranging the plurality of digital data bits into data pairs such that the highest order bits of the data pairs decrease in bit number order from a first data pair to a last data pair and the lower order bits increase in bit number order from the first data pair to the last data pair.

12. The method of claim 11, wherein the arranging the plurality of data pairs of digital data bits into at least one serialized data set further comprises arranging at least one additional bit to be transmitted with a given data pair, such that the one additional data bit is matched with a bit of a given data pair such that bits with higher harmonic content are matched with bits of higher noise content.

13. The method of claim 12, wherein each of the at least one additional data bit is from a center third of the plurality of digital data bits within the data word.

14. The method of claim 10, wherein the arranging the plurality of digital data bits into at least one serialized data set comprises arranging a first pair of data bits followed consecutively by a second pair of data bits to be provided on given data line, the first pair of data bits having bit number orders that are symmetrically opposite each other in the data word, and the second pair of data bits having bit number orders that are symmetrically opposite each other in the data word.

15. The method of claim 10, wherein transmitting the plurality of pairs of data bits comprises transmitting the plurality of digital data bits across each of the one or more data lines at one of a double data rate (DDR), a triple data rate (TDR), and a quadruple data rate (QDR).

16. The method of claim 10, further comprising converting a sample of an analog signal into the data word.

17. An apparatus comprising:
an ADC having:
  a plurality of transmission lines, wherein the transmission lines communicate a data word, and wherein the data word has a plurality of digital data bits is communicated over the transmission lines, and wherein each digital data bits has a bit number order that ranges from a lowest bit number to a highest bit number with the lowest ordered bit numbers having higher noise content than the highest ordered bit numbers and the highest ordered bit numbers having higher harmonic content than the lowest ordered bit numbers; and
  an encoder that is in communication with the transmission lines, wherein the encoder arranges the plurality of digital data bits of the data word as serialized data sets to be transmitted over each of the plurality of transmission lines with consecutive data bits of at least one serialized data set being matched such that bits with the higher harmonic content are matched with bits of the higher noise content; and
a DAC having:
  a plurality of receiver lines, wherein each receiver line is in communication with at least one transmission line; and
  a decoder that is in communication with receiver lines.

* * * * *